(12) United States Patent
Kozlowski (10) Patent No.: US 6,307,378 B1
(45) Date of Patent: Oct. 23, 2001

(54) METHOD AND APPARATUS FOR MEASUREMENT OF ELECTROCHEMICAL CELL AND BATTERY IMPEDANCES

(75) Inventor: James D. Kozlowski, Bellefonte, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 09/747,341

(22) Filed: Dec. 22, 2000

Related U.S. Application Data (60) Provisional application No. 60/174,234, filed on Jan. 3, 2000.

(51) Int. Cl.$^7$ .................................................. G01N 27/416
(52) U.S. Cl. ..................................... 324/430; 324/426
(58) Field of Search ............................. 324/426, 427, 324/430, 434, 436; 320/126, 134, 136

(56) References Cited

U.S. PATENT DOCUMENTS

| | | | |
|---|---|---|---|
| 3,582,774 | * 6/1971 | Forgacs | 324/649 |
| 3,873,911 | 3/1975 | Champlin | 324/430 |
| 3,984,762 | 10/1976 | Dowgiallo | 324/430 |
| 3,997,834 | 12/1976 | Winter et al. | 324/427 |
| 4,129,824 | 12/1978 | Howes | 324/432 |
| 4,231,027 | 10/1980 | Mann et al. | 324/430 |
| 4,259,639 | 3/1981 | Renirie | 324/430 |
| 4,324,251 | 4/1982 | Mann | 607/30 |
| 4,606,350 | 8/1986 | Frost | 607/29 |
| 4,678,998 | 7/1987 | Muramatsu | 324/427 |
| 4,687,996 | 8/1987 | Okazaki et al. | 324/436 |
| 4,697,134 | 9/1987 | Burkum et al. | 324/436 |
| 4,719,428 | 1/1988 | Liebermann | 324/436 |
| 5,047,722 | 9/1991 | Wurst et al. | 324/430 |
| 5,137,020 | 8/1992 | Wayne et al. | 607/29 |
| 5,214,385 | 5/1993 | Gabriel et al. | 324/434 |
| 5,281,920 | 1/1994 | Wurst | 324/430 |
| 5,381,102 | * 1/1995 | Schmidt | 324/720 |
| 5,391,193 | 2/1995 | Thompson | 324/430 |
| 5,483,165 | * 1/1996 | Cameron et al. | 324/427 |
| 5,598,098 | 1/1997 | Champlin | 324/430 |
| 5,773,978 | 6/1998 | Becker | 324/430 |
| 5,821,757 | 10/1998 | Alvarez et al. | 324/434 |
| 5,831,435 | 11/1998 | Troy | 324/426 |
| 6,002,238 | * 12/1999 | Champlin | 324/430 |
| 6,172,483 | * 1/2001 | Champlin | 324/430 |

OTHER PUBLICATIONS

R.D. Armstrong, M.F. Bell and A. A. Metcalfe, "A Method for Automatic Impedance Measurement and Analysis," Journal of the Electrochemistry Society, vol. 77, pp. 287–298, 1977, Elsevier Sequoia S.A., Lausanne—Netherlands.

(List continued on next page.)

*Primary Examiner*—Peter S. Wong
*Assistant Examiner*—Lawrence Luk
(74) *Attorney, Agent, or Firm*—Edward W. Goebel, Jr., Esq.; Jon L. Woodard, Esq.; MacDonald, Illig, Jones & Britton LLP

(57) ABSTRACT

A battery's impedance is measured by a technique that normally uses a current divider network which is connected to the battery. The circuit used according to this technique has a current generator producing a regulated current signal and has one or more sensing impedances which are normally positioned electrically parallel, or in some alternate embodiments in series, with the battery. A DC-blocking capacitor prevents the battery voltage from draining into the one or more sensing impedances. A magnetic field sensor or comparable device measures the magnitude and/or phase of current passing through the sensing impedances. Substitution of a number of calibrated impedances into the circuit in place of the battery permits an initial mathematical computation of the battery's impedance utilizing this technique. Thereafter battery impedances can be computed with the current without using calibrated impendances.

17 Claims, 6 Drawing Sheets

OTHER PUBLICATIONS

J. P. Diard, B. LeGorrec and C. Montella, "EIS Study of Electrochemical Battery Discharge on Constant Load," Journal of Power Sources, vol. 70, pp. 78–84, 1998.

N. A. Hampson, and M. J. Willars, "Programmed Experiments in Electrochemistry," Surface Technology, vol. 7, pp. 247–253, 1978, Elsevier Sequoia S.A., Lausanne—Netherlands.

J. M. Hawkins, "Some Field Experience with Battery Impedance Measurements as a Useful Maintenance Tool," IEEE Proceedings of the $16^{th}$ International Telecommunications Energy Conference, 1994.

S.A.G.R. Karunathilaka, N.A. Hampson, M. Hughes, W.G.Marshal, R. Leek, T.J.Sinclair, "The Prediction of the State–Of–Charge of Some Commercial Primary Cells," Journal of Applied Electrochemistry, vol. 13, pp. 577–586, 1983 Chapman and Hall Ltd.

M. Keddam, Z. Stoynov, H. Takenouti, "Impedance Measurement on $Pb/H_2 SO_4$ Batteries," Journal of Applied Electrochemistry, vol. 7, pp. 539–544, 1977 Chapman and Hall, Ltd.

V. Ganesh Kumar, N. Munichandraiah, A.K. Shukla, "Electrode Impedance Parameters and Internal Resistance of a Sealed Nickel/Metal–Hydride Cell," Journal of Power Sources, vol. 63, pp. 203–208, 1996.

W. G. Marshall, R. Leek, N.A. Hampson, G.R. Lovelock, "A Nickel–Cadmium Cell Residual Charge Analyser," Journal of Power Sources, vol. 13, pp. 75–81, 1984.

Margaretha Sluyters–Rehbach and Jan H. Sluyters, "Sine Wave Methods in the Study of Electrode Processes," Electroanalytic Chemistry, vol. 4, Dekker, NY, 1970.

K. Tachibana, K. Matsuki, "Development of In Situ a.c. Impedance Measurement System Under Constant–Current Conditions and Its Application to Galvanostatic Discharge of Electrolytic Manganese Dioxide in Alkaline Solution," Journal of Power Sources, vol. 74, pp. 29–33, 1998.

C. J. Savant, Jr., Martin S. Roden, Gordon L. Carpenter, Electronic Design Circuits and Systems textbook, $2^{nd}$ Edition, Benjamin/Cummings, CA 1991.

Allen J. Bard, Larry R. Faulkner, Electrochemical Methods, Fundamentals and Applications textbook, Wiley, New York, 1980.

Paul Horowitz, Winfield Hill, The Art of Electronics Textbook, $2^{nd}$ Edition, Chapter 7, pp. 391–470, Cambridge University Press, New York, 1994.

* cited by examiner

METHOD AND APPARATUS FOR MEASUREMENT OF ELECTROCHEMICAL CELL AND BATTERY IMPEDANCES

CROSS-REFERENCE TO RELATED APPLICATIONS

This application claims the benefit from U.S. Provisional Application No. 60/174,234 filed on Jan. 3, 2000.

BACKGROUND

This invention relates to techniques for measuring impedance in electrochemical cells. More particularly, the invention is directed to apparatuses and methods used for taking internal impedance measurements of electrochemical batteries and cells with improved sensitivity and noise/electromagnetic immunity as compared to currently existing methods.

Electrochemical batteries and cells have very low internal impedance. This is true in different types of cells, including those based on either lead acid or nickel cadmium chemistries for which impedances can be on the order of milliohms (m$\Omega$). For this reason, an effective method for measuring impedance must be highly sensitive to small impedance values while being immune to noise and electromagnetic circuit interference. Prior methods of impedance measuring normally utilize one of five different types of electrical circuits: (1) bridge circuits; (2) voltage dividers; (3) 4-wire connections; (4) short circuits; and (5) time constant circuits. However, each of these methods is limited by the inherent characteristics of the particular circuit type used in performing the impedance measurement.

Figure 1:
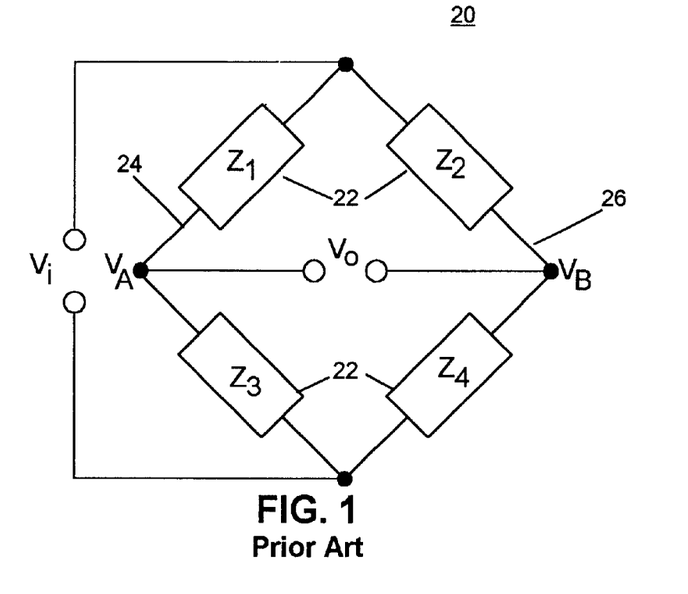
FIG. 1 depicts a typical bridge circuit configuration of the type commonly used in one impedance measuring technique of the prior art.

Bridge circuits are commonly used to sense impedance changes in batteries. Such a bridge circuit 20 is depicted in FIG. 1, which shows the basic configuration of a circuit of this type which is powered by an AC voltage source $V_i$. These circuits generally include impedance elements 22 that are located along first and second current paths 24 and 26, the impedance elements 22 being located on either side of voltage divider points where the voltages $V_A$ and $V_B$ can be measured. For battery impedance measurements, one of the impedance elements 22 in the bridge represents the battery being measured. The output of the bridge, $V_o$, is the potential difference between $V_A$ and $V_B$. The voltages $V_A$ and $V_B$ are related to the input voltage, $V_i$ by the relation $$V_A = V_i \left[\frac{Z3}{Z1+Z3}\right] \text{ and } V_B = V_i \left[\frac{Z4}{Z2+Z4}\right],$$

under the condition that $V_o$ is equal to zero (i.e. $V_A = V_B$), so that (Z1)(Z4)=(Z2)(Z3).

For example, one way of using this circuit is to make one of the impedance elements 22 adjustable and adjust the value of the impedance until $V_o$ is equal to zero. The problem with this type of operation is that it requires continuous adjustment of the element for each frequency at which the measurement is made. This is because battery impedance is not constant over the frequency spectrum of interest.

An automated system for handling such a procedure is complex and difficult to implement. This circuit is typically used by picking nominal values of the three known impedance elements 22 to maximize the output voltage swing as the battery impedance changes through the sweep of frequencies and usable life. The sensitivity of the output is maximized when Z2=Z3 and Z1=Z4. This implies that one of the impedance elements 22 must have a value that is the complex conjugate of the battery impedance.

Another limitation of bridge circuits relates to the fact that since internal impedance is very low for most cell types, voltage drops across the battery will also be very low. Fixing the values of all but one impedance element 22 and allowing only this battery impedance element to change implies that either $V_A$ or $V_B$ will remain constant. The bridge 20 reduces to a voltage divider for changes in the battery impedance. The output voltage is inversely proportional to changes in the battery impedance. Thus, as the impedance of the battery increases, output voltage becomes smaller. To get sufficiently large voltage drops at the output, a large amount of current is required. For example, if the magnitude of the battery impedance were 5 m$\Omega$, a 1 A current would be required to produce a 5 mV drop at the output.

Such a condition would place a high gain requirement on any sensing amplification equipment connected at the output of the bridge circuit. For example, the input impedance of such an amplifier would be the impedance of the bridge circuit 20 and would be very low due to the low battery impedance. Where such low input impedances are involved, such as those below 1$\Omega$, amplifiers become highly susceptible to electrical field noise, whether self-generated or from other sources. This condition is compounded where the input signal is also very low. Adverse interference effects can be expected regardless of whether BJT or FET input stages are used. Although the addition of a transformer across $V_o$ is typically recommended in cases of low input impedance, the addition of such a device tends to contribute to circuit impedance, lowering the circuit's sensitivity. Alternatively, where a sufficiently high turns ratio is present, an added transformer can reduce the bandwidth of the output signal produced.

Since bridge circuits do not easily permit impedance sensing without adjustment of the known impedance elements 22, the circuit has no more sensitivity than the voltage divider circuit. Thus, such circuits are normally only usable in laboratory settings where the impedance elements can be adjusted.

Figure 2:
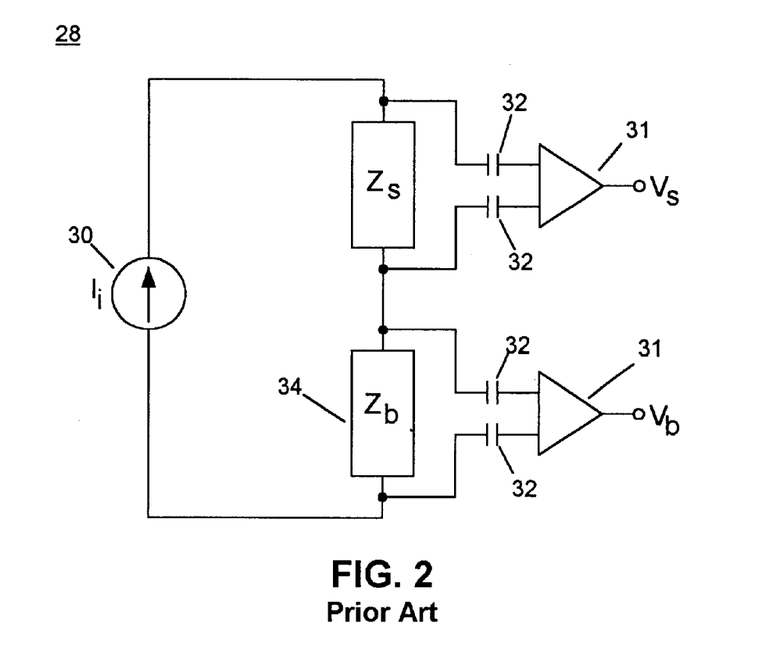
FIG. 2 depicts a typical voltage divider configuration of the type commonly used in an additional impedance measuring technique of the prior art.

A second commonly used technique for impedance measuring uses a voltage divider circuit, which is typically preferred over bridge circuits when adjustment of impedance is not required. A voltage divider circuit 28 used for battery impedance measurements is shown in FIG. 2. The circuit 28, like most designs of this type, is driven by an AC current source 30 since voltage levels are typically in the range of millivolts and current in the range of amperes and thus amperage is easier to regulate than voltage. The circuit includes a sensing impedance $Z_s$ and a battery impedance $Z_b$ in a series loop 29 with the AC current source. Each sensing and battery impedance has a respective sensor 31 that connects to the series loop 29 at the respective impedance's point of positive and negative potential. Each sensor 31 is separated from the series loop 29 by capacitors 32 used to block the battery's DC signal. This technique involves two measurements: (1) measurement of the voltage $V_s$ across a sensing impedance $Z_s$, permitting measurement of the loop current given the known size of $Z_s$; and (2) measurement of the voltage $V_b$ across the battery 34 being measured.

Voltage divider circuits used to measure battery impedance are limited by the same disadvantages as bridge circuits. Like bridge circuits, voltage measurements are taken in the millivolt signal level since batteries have very low impedance. Thus, voltage divider circuits, like bridge circuits, are susceptible to electrical field noise and have limited sensitivity.

Figure 3:
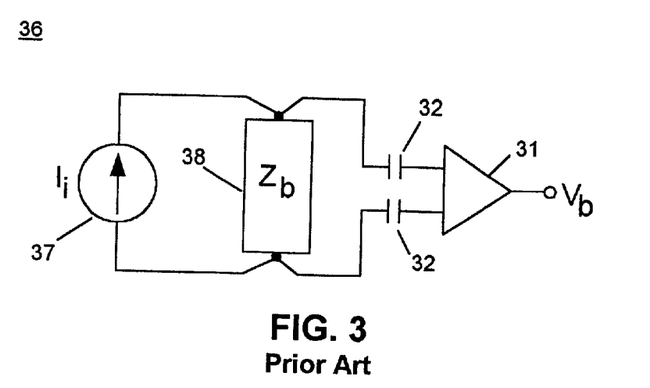
FIG. 3 represents a basic 4-wire configuration of the type used in the prior art.

A third technique utilizes a circuit known as a 4-wire or "Kelvin" connection. This is among the most frequently used techniques for measuring battery impedance and has been described in numerous patents and other references. The general configuration of a 4-wire connection 36 is shown in FIG. 3. In principle, this circuit is very similar to a voltage divider circuit, being driven by a current source 37. But the 4-wire connection 36 does not have a sensing impedance $Z_s$. A battery 38 is interrogated with a current signal, and the voltage drop $V_b$ across the battery 38 is measured with a sensor 31 separated from the battery nodes by capacitors 32. As indicated above, for most lead acid and nickel cadmium cells, the internal impedance $Z_b$ is very low. This means that the battery 38 will be driven with amperes of current, and output signals will be on the order of millivolts of potential.

Most of the problems associated with bridge circuits and voltage dividers also apply to 4-wire connections. In fact, U.S. Pat. No. 5,821,757 to Alvarez et al. specifically addresses the problem of reducing electromagnetic interference (EMI) that adversely affects the 4-wire connection described in U.S. Pat. No. 5,281,920 to Warst with the addition of twisted, shielded-paired wires. Other attempts to reduce system noise have included the incorporation of ground isolation, the selection of driving frequencies away from known sources of electric field noise, and the combined techniques of windowing and averaging.

The fact that there is a need for each of these attempted remedies demonstrates the inherent limitations of this type of circuit. In such a system, larger output signals require a larger input current signal. For example, output signals on the order of tens of millivolts require input signals on the order of tens of amperes. However, sensitivity tends to be inversely related to the impedance of a battery. Since larger cell sizes ultimately lead to progressively smaller internal impedances, then for progressively larger cells, output voltages produced using the 4-wire technique tend to be smaller for the same input current. It follows that this technique is generally inadequate for using in a broad range of cell sizes.

Figure 4:
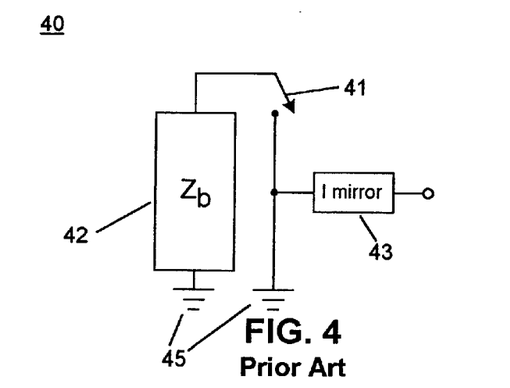
FIG. 4 depicts a typical a short circuit configuration used in the prior art.

Another technique used to measure battery impedance is the short circuit configuration. This configuration is less common than others described above and has been used in applications where internal impedance magnitudes have been on the order of hundreds to thousands of ohms, such as in lithium iodine batteries used in pacemakers and related devices. A simplified illustration of a short circuit 40 is shown in FIG. 4. The circuit has a switch 41 connected to the positive node of a battery 42 having an impedance $Z_b$. The battery's negative node is grounded, while the switch 41 connects the positive node to a current mirror 43 and to ground 45. This technique simply involves taking a voltage measurement on the unloaded battery 42 followed by a measurement of the short-circuited current to calculate a measure of the battery's internal impedance $Z_b$. The short circuit is only applied long enough to get an accurate enough measurement of the discharge current.

Although this technique is useful for calculating impedance in small, lithium iodine batteries, other larger battery types, including larger lithium iodine and most lead acid batteries, pose a serious explosion hazard when similarly short circuited. This technique is also limited in that it can only be used to get a bulk number to represent the battery's internal impedance, which eliminates all phase and frequency related information.

Figure 5:
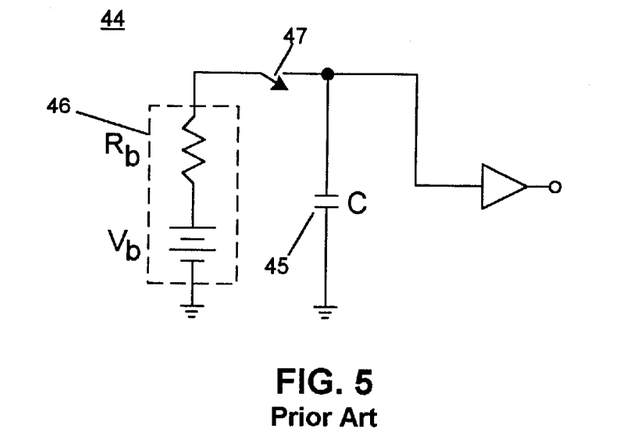
FIG. 5 is a prior art time constant configuration circuit.

One additional technique that is commonly used to measure battery impedance is the time-constant method. As demonstrated in the example circuit in FIG. 5, this method is based on the concept of an RC time response of a battery 44 where R is contributed from a battery 46 and a capacitor 45 is a selected known value C. The battery is connected between ground and a normally-open switch 47 which is connected through capacitor 45 to ground. The charge $V_c$ across the capacitor 45 can be monitored through operational amplifier 49. In operation, switch 47 is closed, causing the battery voltage $V_b$ to discharge through battery resistance $R_b$ to charge capacitor 45. The time it takes to charge the capacitor 45 to the voltage $V_b$ is used to determine battery resistance $R_b$ since the capacitance C of capacitor 45 is known and the time $\tau = R_b C$.

This method has been incorporated into lithium iodine cells used in medical devices such as pacemakers. It includes switching a battery into a circuit with a parallel capacitor and then measuring the time response to determine the time constant, $\tau = RC$.

As with other techniques, the battery's internal impedance is assumed to be a resistive element and the resulting measurement is reduced to a bulk number. No information about phase or frequency contributions is measured or determined. The technique is also limited in that there is a necessary tradeoff between capacitor size and processing speed of the detection circuit. A larger capacitor requires a larger amount of energy to be drawn from the battery, while the smaller the capacitors, the less time there is for the detection circuit to determine the time constant, affecting the sensitivity of the circuit. This relative dependence on the capacitor's size ultimately affects the circuit's sensitivity.

Most prior art methods of measuring internal impedance in batteries rely heavily on taking voltage measurements. Due to the very low impedance magnitudes involved, output signals are normally expected in the range of millivolts. This means that in order for most prior art methods to be operable, high gain amplifiers having a combination of low voltage signals and low input impedances to the amplifier must be used, implying a high level of susceptibility to noise and EMI. The related apparatus sensitivities of most prior art methods are also related to the impedance of the measured battery. As battery cells become progressively larger, internal impedance becomes smaller. Voltage measurements in turn become progressively smaller, thereby reducing the sensitivity of the measuring circuit. Although increasing input current can improve the output signal, such a step can be prohibitive since a magnification from amperes to tens of amperes may be required to achieve the desired effect.

Frequent measurements at high current levels not only impose a higher power requirement on the circuit, but also subject the battery to higher levels of energy. Such conditions can potentially contribute to heating and eventual disruptions in normal cell reactions. As confirmed by the number of past efforts to improve existing impedance measurement techniques, a new technique for measuring impedance is needed that is less sensitive to noise and EMI effects. Such a technique should also be less dependent on direct voltage measurements that are taken across the subject battery, while remaining usable for a variety of battery sizes and configurations.

SUMMARY

In accordance with this invention, battery impedance $Z_s$ of a battery is measured by a circuit, such as a current divider network which is connected to the battery. The circuit has a current generator producing a current signal $I_i$ and has one or more sensing impedances $Z_s$ which are normally positioned electrically parallel, or in some alternate embodiments in series, with the battery. A DC-blocking capacitor is positioned in series with the battery to prevent the battery voltage from draining into the one or more sensing impedances $Z_s$. A magnetic field sensor or comparable device for measuring the electromagnetic field produced by the current flowing through a wire, is then used to measure the current $I_s$ passing through the sensing impedances $Z_s$. Either the magnitude or the phase, or both, of $I_s$ can be measured to arrive at a usable value.

Once the value of $I_s$ has been determined, the value of the impedance is mathematically determined. This can be done, for example, by substituting a number of calibrated impedances having values $Z_{cal1}$ through $Z_{calN}$, into the circuit in place of the battery and its impedance value $Z_b$. In one illustrative method, for example, the mathematical determination includes accounting for the effects of the combined circuit and connector impedances Z1 and Z2 which lead, respectively, into the parallel sensing and battery impedances $Z_s$ and $Z_b$. An additional accounting is made for the effect of the combined circuit and connector impedance Z3 leading out of the sensing impedance $Z_s$ and the combined circuit, connector and blocking capacitor impedance Z4 leading out of the battery impedance $Z_b$. This results in the relationship:

$$Z_b = I'(Z_s + Z1 + Z3) + (Z2 + Z4)$$

where $$I' = \frac{I_s}{I_i - I_s},$$

so that:

$$Z_b = \frac{I_s}{I_i - I_s}(Z_s + Z1 + Z3) + (Z2 + Z4)$$

where the values of Z1, Z2, Z3, and Z4 may be unknown. In this example of the technique, two calibrated impedances $Z_{cal1}$ and $Z_{cal2}$ are substituted into the circuit for the battery impedance $Z_b$ where:

$$Z_x = Z_s + Z1 + Z3 \text{ and } Z_y = Z2 + Z4$$

so that $$Z_b = I'Z_x + Z_y$$

resulting in an $I_s$ value of $I_1$ when $Z_{cal1}$ is substituted for $Z_b$ and resulting in an $I_s$ value of $I_2$ when $Z_{cal2}$ is substituted for $Z_b$ so that $$Z_x = \frac{Z_{cal1} - Z_{cal2}}{I_1 - I_2},$$

and so that $$Z_y = \frac{I_2 Z_{cal1} - I_1 Z_{cal2}}{I_1 - I_2},$$

with the final step in this example being the simple determination of the value of $Z_b$ by substitution into the equation $$Z_b = I'Z_x + Z_y.$$

While the illustrative embodiment of this invention utilizes two calibrated impedances $Z_{calN}$, it will be appreciated that a larger number of calibrated values may be used to achieve the necessary measurement of $Z_b$ as will be explained further in the following Detailed Description of the Preferred Embodiments. It will also be appreciated that, as reflected in the series embodiment of the incorporated circuit described below as an alternative embodiment of the invention, various circuit configurations are also possible in carrying out the disclosed impedance measuring technique and are fully contemplated as being within the scope of this invention. For example, the use of additional, parallel sensing impedances $Z_s$ may be preferred and are contemplated.

Thus, the invention does not reside in any one of the features of the impedance measuring apparatus and method which is disclosed above and in the Detailed Description of the Preferred Embodiments and claimed below. Rather, this invention is distinguished from the prior art by its particular combination of features disclosed. Important features of this invention have been disclosed in the Detailed Description of the Preferred Embodiments of this invention which are shown and described below, to illustrate the best mode contemplated to date of carrying out this invention.

Those skilled in the art will realize that this invention is capable of embodiments which are different from those shown, and the details of the structure of the impedance measuring apparatuses and the details of the disclosed impedance measuring methods can be changed in various manners without departing from the scope of this invention. Accordingly, the drawings and description are to be regarded as illustrative in nature and are not to restrict the scope of this invention. Thus, the claims are to be regarded as including such equivalent apparatuses and methods as do not depart from the spirit and scope of this invention.

BRIEF DESCRIPTION OF THE DRAWINGS

For a more complete understanding and appreciation of this invention and many of its advantages, reference will be made to the following, detailed description taken in conjunction with the accompanying drawings wherein.

DETAILED DESCRIPTION OF THE PREFERRED EMBODIMENTS

Referring to the drawings, identical reference numbers and letters designate the same or corresponding parts throughout the several figures shown in the drawings.

The proposed technique for making impedance measurements deals directly with the limitations of prior art measuring techniques. As noted in the Background above, most previous impedance measurement techniques rely on voltage measurements made across the battery and/or sensing impedance. These measurements are in the order of millivolts, driven at amps of current through milliohms of impedance. Thus, it is very difficult to measure such current levels by merely measuring the voltage across a sensing impedance $Z_s$. For example, as noted in the Background, a simple voltage measuring device is highly susceptible to the effects of noise, EMI, and the current drain of the battery itself. However, an alternate way of measuring a current I in given leg of an electrical circuit is to measure the magnetic field generated at a sensing branch of the circuit. Such a current I can be appropriately measured either by its magnitude or change in its phase angle or both.

Figure 6:
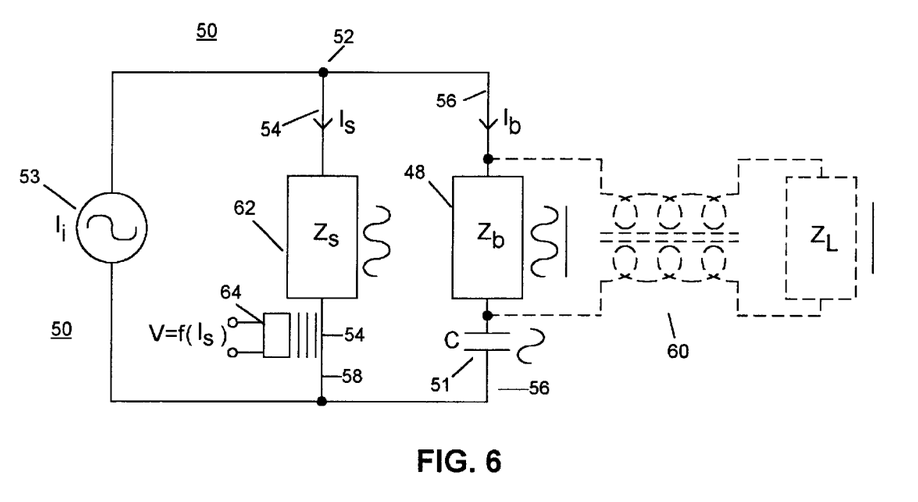
FIG. 6 is a general form of a proposed circuit which is according to the principles of this invention.

FIG. 6 depicts a general form of a circuit which may be used to calculate a battery's impedance according to the proposed technique. The circuit has the general construction of a current divider network. C represents the capacitance of a DC-blocking capacitor 51 that is selected large enough for the AC range of interest. Selection of an appropriate size of capacitor 51 is dependent upon the lowest frequency level, or "half power frequency," which the capacitor allows to pass through it, determined by the formula $$C = \frac{1}{2\pi Z_s f_h}$$

where C is the capacitor's capacitance value and $f_h$ is the half power frequency, and $Z_s$ is the magnitude of this impedance and does not include its phase angle. Without the DC-blocking capacitor 51, current from the battery 48 would drain into the sensing impedance $Z_s$. Ideally, $Z_s$ is kept as close as possible to the anticipated impedance of the battery to be measured.

$Z_b$ represents the battery impedance that is being measured by the circuit, $I_i$ represents the input current signal and $I_s$ represents the sensing impedance current. Additionally, $I_b$ represents the AC current through the battery 48, though the actual current in the cell may contain a DC component if a load is connected to the battery 48. In this embodiment of the proposed circuit, current $I_i$ travels from a current source 53 through a current signal path 50 to a current dividing connector 52 where it splits into portion $I_s$, flowing through sensing current path 54, and into portion $I_b$, flowing through battery current path 56. The sensing current and battery current paths 54 and 56 eventually re-converge at current converging connector 58. If measurements are done online, the AC current signal can be choked with an appropriate AC choke 60, if necessary, so the load impedance, $Z_L$ is much larger than $Z_s$ and $Z_b$.

To determine the battery impedance, $Z_b$, requires recognition of the basic relations $$I_i = I_s + I_b$$

and $$Z_b = \frac{V_b}{I_b}.$$

Neither the battery voltage $V_b$ nor the sensing impedance voltage $V_s$ are measured directly. However, since the $I_s$ and $I_b$ branches are parallel, $$V_b = V_s = I_s Z_s$$

then $$Z_b = \left(\frac{I_s}{I_i - I_s}\right) Z_s.$$

Figure 7:
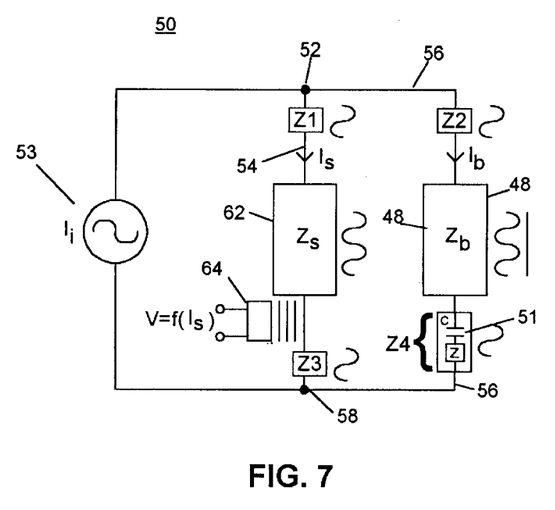
FIG. 7 is a general form of a proposed circuit with connector, wire, and capacitor impedance values denoted before and after both the sensing impedance and the battery impedances.

When battery sizes become very large, cell internal impedance becomes very small, so that impedance contributions from connectors and wires cannot be ignored. Thus, the circuit must be remodeled to include these additional impedance elements. Each of these particular elements is included in FIG. 7, with the load being omitted. In this particular embodiment of the circuit, the impedance resulting from capacitance C of DC-blocking capacitor 51 is lumped with the impedance of the connector and local segment of the battery current path 56 as Z4. Z1, Z2, and Z3 represent the connector and wire impedances of sensing element 62 and battery 48. $Z_s$ is a known value, and as noted above, is ideally kept as close as possible to the impedance of the battery to be measured. However, unlike $Z_s$, the values of Z1, Z2, Z3, and Z4 are not known explicitly. For this circuit, it is known that $$V_s = V_b$$

which can be written as $$I_s(Z_1 + Z_s + Z_3) = I_b(Z_2 + Z_b + Z_4).$$

The definitions $$Z_X \equiv Z_s + Z_1 + Z_3$$

and $$Z_Y \equiv Z_2 + Z_4$$

allow for the relation $$Z_b = \left[\frac{I_s}{I_i - I_s}\right] Z_X + Z_Y.$$

Further, the definition $$I' \equiv \frac{I_s}{I_i - I_s}$$

allows for the relation $$Z_b = I' Z_X + Z_Y.$$

For this equation, I' is known and measured. However, $Z_X$ and $Z_Y$ are not precisely known, and may not be known at all. $Z_b$ is the value that must be determined.

As an example of this technique, the values of $Z_X$ and $Z_Y$ can be determined experimentally using two different calibrated impedances, $Z_{cal1}$ and $Z_{cal2}$. The example procedure involves removing the battery 48 from the circuit and replacing it with $Z_{cal1}$ first and then $Z_{cal2}$. It will be appreciated, however, that removal of the battery 48 may not always be necessary in order to complete the required measurements according to the invention, for example if the values of Z1, Z2, Z3 and Z4 are small in relation to $Z_b$ and $Z_s$, or if the values of Z1, Z2, Z3 and Z4 are already known. In this example, a measurement of $I_s$ is made for each of the two calibrated impedances $Z_{cal1}$ and $Z_{cal2}$. This results in two equations derived from the previous equation for $Z_b$, $$Z_{cal1} = I_1 Z_X + Z_Y$$

$$Z_{cal2} = I_2 Z_X + Z_Y$$

Solving for $Z_X$ and $Z_Y$ leaves the relations, $$Z_X = \frac{Z_{cal1} - Z_{cal2}}{I_1 - I_2}$$

$$Z_Y = \frac{I_2 Z_{cal1} - I_1 Z_{cal2}}{I_1 - I_2}$$

Once $Z_X$ and $Z_Y$ are determined, the battery 48 can be placed back into the circuit and the previous equation $$Z_b = I' Z_X + Z_Y$$

can be used to later determine $Z_b$ after a value for $I_s$ is determined.

It will be appreciated that, while the impedance determination of this example is made using two impedance values, it is also possible to use more than two calibration values, and this possibility is fully contemplated to be within the scope of the invention. For example, given the relation $$Z_b = I' Z_X + Z_Y,$$

in which $Z_x$ and $Z_y$ are not precisely known, a number N of known calibration impedances $Z_{cal1}$ through $Z_{calN}$ can be substituted for $Z_b$ in the circuit, allowing for a measurement of $I_s$ to be made for each of the calibration impedances leaving N separate relations $$Z_{cal1} = I_1 Z_x + Z_y$$

.

.

.

$$Z_{calN} = I_N Z_x + Z_y,$$

which, depending on the range of the calibration impedances, can be solved linearly, piecewise-linearly, or nonlinearly for $Z_x$ and $Z_y$.

It should be noted that, unlike the prior art techniques discussed above, the voltage drops across $Z_s$ and $Z_b$ are never measured directly. Once the circuit is calibrated for $Z_x$ and $Z_y$, the battery 48 can be placed back into the circuit for the determination of $Z_b$ from the measurement of $I_s$.

Figure 8:
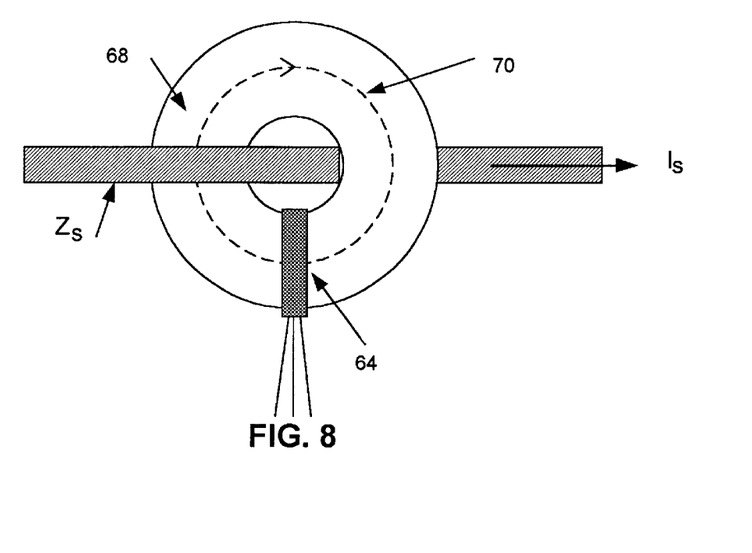
FIG. 8 represents a magnetic interface for sensing current $I_s$ according to the principles of this invention.

Detection of $I_s$ is accomplished by magnetically coupling $I_s$ with a magnetic field sensor 64 such as a Hall effect or a magnetoresistive sensor or any other device which can determine the magnitude and phase of a magnetic field. This is possible if $Z_s$ is an electrical conductor such as copper. An appropriate magnetic interface 66 is depicted in FIG. 8. The figure shows how the magnetic interface links the sensing current, $I_s$ to the magnetic sensor 64. The interface includes a ferromagnetic core 68 which is coupled to the magnetic field sensor 64 and which need not be wound. The sensing current $I_s$ travels along the sensing impedance $Z_s$ throughout the ferromagnetic core 68 resulting in a magnetic flux 70. The size and shape of the conductor $Z_s$ should be selected to maximize sensitivity of the current change when the battery impedance $Z_b$ changes and maximizes the flux linkage to the magnetic circuit.

$Z_s$ represents a single turn winding on the magnetic core 68 and the magnetic sensor 64 sits in the air gap that dissects the core path. The magnetic flux density that the magnetic field sensor 64 is exposed to is given by the equation $$B_{gap} = \frac{\mu_0 \mu_{core}}{l_{core} + \mu_{core} l_{gap}} I_s.$$

This equation assumes the cross sectional area of the air gap is the same as the core. $B_{gap}$ is the magnetic flux density of the air gap and $l_{gap}$ is the effective gap length. Also, $l_{core}$ is the effective core flux path length, $\mu_{core}$ is the core permeability factor and $\mu_0$ is the permeability of free space. It should be noted that this equation was derived under static assumptions and nonlinear and dynamic properties such as hysteresis and core saturation are considered negligible factors for purposes of this invention description. The equation shows that the air gap length is the dominant factor for the sensitivity of the flux density to the sensing current $I_s$. If a large enough current is used and if the magnetic field sensor 64 is sufficiently sensitive, a core 68 may not be necessary.

The choice of magnetic field sensor 64 must include considerations such as the sensor's ability for mounting in the core path and the ability to provide sufficient sensitivity to detect the sensing current $I_s$. Some suitable types that have been successfully implemented include Hall effect and anisotopic magnetoresistive (AMR) sensors which are readily available. AMR sensors, such as the Honeywell HMC1001, have demonstrated greater levels of sensitivity than Hall effect sensors, such as the Optek OHN-xx, for operation in small magnetic fields. AMR sensors also offer a much wider bandwidth at approximately the same cost as Hall effect sensors. Other alternative sensor types may present problems due to cost, bandwidth, and size. Some alternatives, such as the use of secondary windings as the magnetic sensor 64, present an additional limitation in that they tend to introduce impedance into the circuit and constrain the bandwidth. However, it is contemplated that additional, satisfactory magnetic field sensors will be developed over the years for use according to this invention.

Advantages of the invention over previous impedance measuring techniques include greater sensitivity and greater immunity to noise and EMI. In the proposed circuit, sensitivity is controlled mainly by the selection of the sensing impedance and the gap size of the core 68. The fact that no potential measurements are taken across low voltage and impedance sources results in greater immunity to noise and EMI. Most previous methods require that measurements of voltage drops be made across the battery 48 and/or sensing impedance. In comparison, the proposed technique requires only that a current measurement be made.

For prior art methods of measuring battery impedance, such as the 4-wire circuit, the voltage drop across the battery will become progressively smaller as cell sizes increase. This results in the circuit becoming increasingly less sensitive as the magnitude of each measurement falls. It follows that the change in sensitivity is dependent on the internal impedance of the battery being monitored. Since the technique proposed by this invention measures only current with proper selection of a sensing impedance, sensitivity becomes independent of the measured internal impedance. Thus, given the proper selection of the sensing impedance, circuit sensitivity using the technique of this invention will be approximately the same in both large and small capacity cells. In addition, the overall measurement sensitivity of the disclosed technique is superior to that of previous measurement techniques. When, by way of example, an AMR sensor is used in conjunction with the technique of this invention, sensitivity has been shown experimentally to improve 26 times over the level of a prior art 4-wire circuit. Reducing the core air gap size may further increase sensitivity of this technique.

A further advantage of the invention relates to inherent noise and EMI limitations of previous techniques, such as the 4-wire circuit. In such previous techniques, sensing amplifiers are required to amplify signals in the range of millivolts from a low impedance source, the battery, or sensing impedance. Such amplification typically requires the use of transistor amplifiers, such devices being highly susceptible to electric field noise sources when the input source impedance is low.

In the proposed circuit configuration, sufficiently high current, typically in the range of milliamps or greater, is sensed by the magnetic interface 66 and is more immune to noise and EMI than voltage gain amplifiers would be. The sensing amplifier for this circuit is connected to the magnetic field sensor 64, which, as noted above, has much higher impedance and voltage levels due to the improved sensitivity. For example, a Honeywell HMC1001 has a source impedance of 850Ω while, with other AMR sensors typically having source impedances in the range of hundreds to thousands of ohms.

Figure 9:
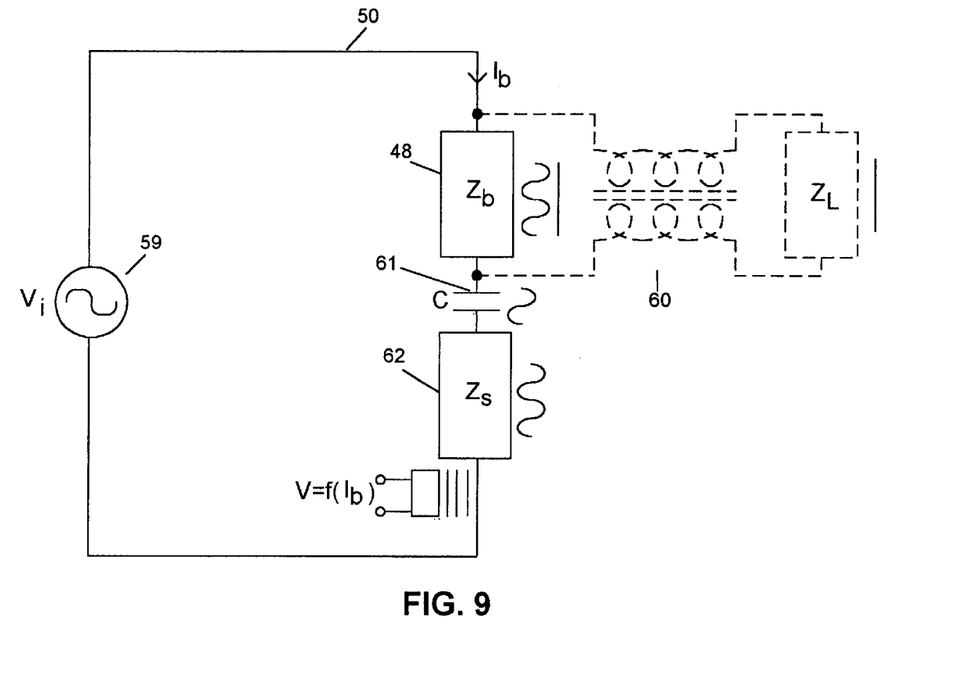
FIG. 9 is an alternative series embodiment of a proposed circuit according to the principles of this invention.

It will be further appreciated that alternate forms of the disclosed circuit may be implemented with the proposed technique and are contemplated to be within the scope of this invention. One such alternate form of the proposed circuit is depicted in FIG. 9 and can be a voltage driven circuit having a voltage source 59 and also having a magnetic coupling in series with the battery 48 as shown in the figure. In this embodiment, the DC-blocking capacitor 61 is positioned in series between the battery impedance $Z_b$ and sensing impedance $Z_s$. According to the proposed technique, an impedance measurement of the battery 48 would be accomplished first by noting that $$V_i = V_b + V_s$$

and by noting that the sensing current $I_s$, which in this embodiment is also the battery current, can be expressed by the relation $$I_s = \frac{V_i}{Z_b + Z_s}.$$

It would then follow that $$V_i = I_s(Z_b + Z_s)$$

and $$Z_b = \frac{V_i - I_s Z_s}{I_s}.$$

Thus, implementation of this circuit embodiment requires knowledge of the source voltage $V_i$, sensing impedance $Z_s$, as well as measurement of the sensing current $I_s$. In practice, this configuration is capable of making impedance measurements that are similar to other embodiments of the invention. However, unlike other embodiments, this specific configuration of the proposed circuit requires the inclusion of a voltage source $V_i$ which must maintain potential magnitudes on the order of millivolts. Unlike other circuit configurations of this invention, this embodiment requires that for progressively larger battery cells, the voltage source $V_i$ must become progressively smaller in order to maintain operability. Regulation of the voltage source $V_i$ may become increasingly difficult for smaller battery impedances without an increase in the level of current delivered.

Figure 10:
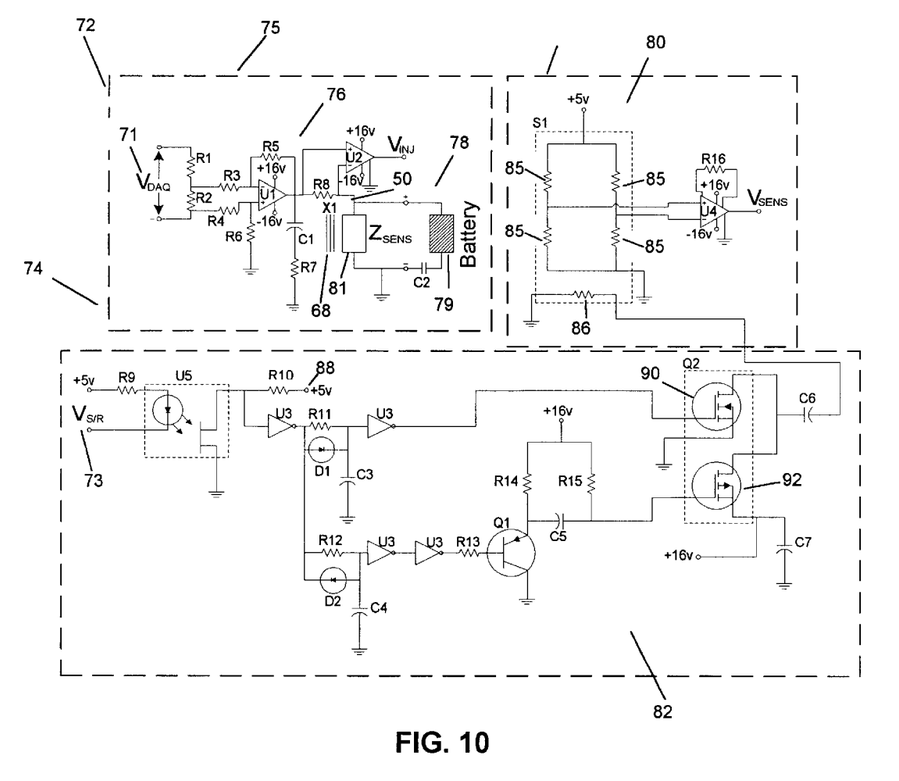
FIG. 10 is an electrical schematic of a prototype circuit implementing the invention concept.

FIG. 10 is a schematic illustration of an example prototype circuit 72 incorporating the invention that can be used to collect battery impedance data from lead acid, nickel cadmium and lithium battery cells. The circuit 72 is designed to be used with a PC based data acquisition (DAQ) board. The DAQ board is used to inject a waveform ($V_{DAQ}$) into the circuit at input 71 and toggle the set/reset circuit 82 of the AMR sensor with a signal ($V_{S/R}$) at input 73. To sample the injected current waveform and sensed current waveform, the DAQ board has access to the feed current ($V_{INJ}$) and sensor response signal ($V_{SENS}$). The circuit section 74 in the upper left dashed box 75 represents the current source 76 and current divider circuit 78. This section drives the current into the battery 79 and sensing element 81. The injected waveform $V_{DAQ}$ is passed to the signal amplifier U1 which in turn generates the current $I_i$. The differential amplifier U2 is used to detect and to determine the value of $I_i$ as it exists at the negative node of resistor R8 and enters the current signal path 50. A ferromagnetic core X1 of the magnetic sensor detects the value of $I_s$ at the sensing impedance 81.

The circuit section 80 in the upper right dashed box 83 represents the current sensing circuit that is linked to the sensing element via the ferromagnetic core X1 and the magnetic sensor S1. Within the magnetic sensor S1, the combined resistances of component resistors 85 change in proportion to the magnetic field they encounter at the sensing impedance 81, with S1 essentially comprising the ferromagnetic core X1. Within S1, a degaussing resistor 86 comprises a coil used for demagnetizing the component resistors 85 of the ferromagnetic core X1. In the event that an external magnetic signal interferes with the core's operation, the interference (magnetic offset) can be minimized by passing a positive voltage through the degaussing resistor 86 proximate to the component resistors 85.

The circuit section of the bottom dashed box 82 of FIG. 10 shows the set/reset circuit used for minimizing the magnetic offset in the magnetic sensor. In the circuit, a signal $V_{S/R}$ at input 73 is electrically isolated from the rest of the circuit by an optical coupling U5. To minimize a magnetic offset in the sensor S1, the signal $V_{S/R}$ which is normally on the order of +5 V, is manually dropped to 0 V for a duration of, for example, one second. While the optical coupling U5 electrically isolates the signal $V_{S/R}$ from the rest of the circuit, U5 still permits a mimicking +5 V signal to pass from mimicking potential 88 through resistor R9 in response to each positive (+5 V) condition for $V_{S/R}$. Mimicked signals are fed through four digital inverters U3, all of which may be contained on a single electronic chip allowing the signal to pass to a complementary MOSFET pair Q2. The MOSFET pair Q2 includes an N-channel MOSFET 90 and an E-channel MOSFET 92, the pair functioning together as a combination toggle switch for effecting positive voltage through resistor 86. All four digital inverters act in concert to alternate the positive conditions of the N- and E-channel MOSFETS in order to toggle positive voltage through the degaussing resistor 86 depending on whether $V_{S/R}$ is currently in its positive +5 V condition. Minimizing the magnetic offset in this way insures that the magnetic sensor does not saturate or drift from the zero field point, helping to maintain high sensor resolution. This further enables the circuit to be used to collect impedance data on batteries while charging and discharging.

Figure 11:
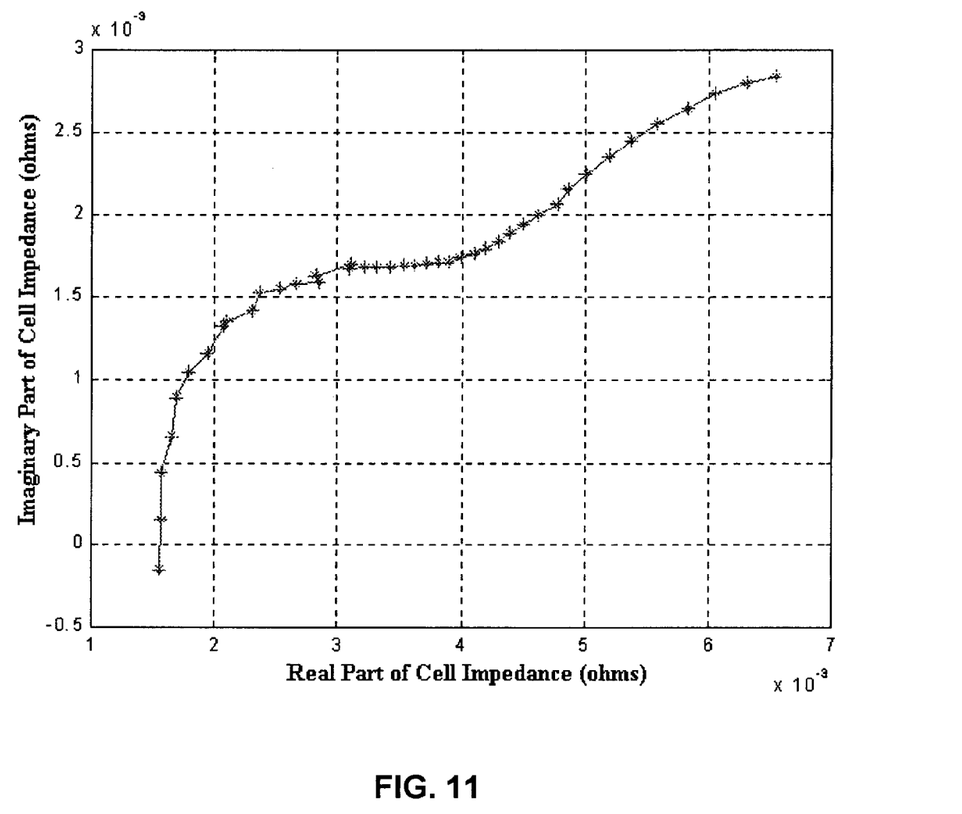
FIG. 11 is a graphical representation of impedance of a nickel cadmium battery during discharge.

FIG. 11 is a sample plot of the impedance measured for a D-size, 4.3-Ahr nickel cadmium cell during discharge. Each point in the plot represents the cell impedance $Z_b$ at different frequencies ranging from 1 Hz at the upper right end of the curve to 17.7 kHz at the lower left end of the curve. The data for this plot was obtained using the prototype circuit of FIG. 10 on a nickel cadmium cell during a discharge cycle. It will be appreciated that those skilled in the art will normally test a particular battery at one or more frequencies to determine the battery's impedance $Z_b$ at each frequency. It will be further appreciated that a subject battery may be tested at many selected frequencies to determine the condition of the battery in question, and that the invention permits those skilled in the art to perform testing across such frequency ranges as appropriate.

Those skilled in the art will recognize that the various features of this invention described above can be used in various combinations with other elements without departing from the scope of the invention. Thus, the appended claims are intended to be interpreted to cover such equivalent impedance measuring techniques that do not depart from the spirit and scope of the invention.

What is claimed is:

1. An apparatus for measuring impedance in an electrochemical cell comprising:
    a current generator for producing an input current signal $I_i$ along a current signal path in a current divider network;
    said current divider network having at least a sensing current path and a battery current path, said sensing and battery current paths being in parallel to each other, each of said sensing and battery current paths also being in series with said current signal path, said current signal, sensing, and battery paths interconnecting with each other at a current dividing connector and at a current converging connector;
    said sensing current path having a measurable sensing impedance $Z_s$ located along said sensing current path, a connector-wire impedance $Z_1$ between said current dividing connector and said sensing impedance $Z_s$, and a connector-wire impedance $Z_3$ between said sensing impedance $Z_s$ and said current converging connector, wherein a portion $I_s$ of current signal $I_i$ flows through said sensing current path;
    said battery current path having a battery impedance $Z_b$ located along said battery current path, a connector-wire impedance $Z_2$ between said current dividing connector and said battery impedance $Z_b$, and a connector-wire-capacitor impedance $Z_4$ between said battery impedance $Z_b$ and said current converging connector, wherein a portion $I_b$ of current signal $I_i$ flows through said battery path;
    a DC-blocking capacitor in series with said battery impedance $Z_b$ and located along said battery current path to prevent said battery from discharging current through said sensing impedance $Z_s$;
    said sensing current path also having a magnetic field sensor with a coupling attached thereto for measuring the magnitude and phase of $I_s$, thereby permitting mathematical determination of the value of $Z_b$.

2. The apparatus for measuring impedance in an electrochemical cell of claim 1 in which the magnetic field sensor used for measuring the magnitude and phase of $I_s$ is a magnetoresistive sensor magnetically coupled to the sensing current path.

3. The apparatus for measuring impedance in an electrochemical cell of claim 1 in which the magnetic field sensor used for measuring the magnitude and phase of $I_s$ is a Hall effect sensor magnetically coupled to the sensing current path.

4. The apparatus for measuring impedance in an electrochemical cell of claim 1 in which the magnetic field sensor used for measuring the magnitude and phase of $I_s$ is a magnetic resistive sensor magnetically coupled to the sensing current path;
    said apparatus being further configured to experimentally determine $Z_b$ by measuring the variable $I_s$ when at least two different calibrated impedances $Z_{cal1}$ through $Z_{calN}$ are substituted for $Z_b$ into the circuit of said apparatus.

5. The apparatus for measuring impedance in an electrochemical cell of claim 1, said apparatus being further configured to experimentally determine $Z_b$ from the measurement of the variable $I_s$ when at least two different calibrated impedances $Z_{cal1}$ through $Z_{calN}$ are substituted into said current divider network of said apparatus.

6. An apparatus for measuring impedance in an electrochemical cell comprising:
    a current generator for producing an input current signal $I_i$ along a current signal path in a current divider network;
    said current divider network having a sensing current path and a battery current path, said sensing and battery current paths being in parallel to each other, each of said sensing and battery current paths also being in series with said current signal path, said current signal, sensing, and battery paths interconnecting with each other at a current dividing connector and at a current converging connector;
    said sensing current path having a measurable sensing impedance $Z_s$ located along said sensing current path, a connector-wire impedance $Z_1$ between said current dividing connector and said sensing impedance $Z_s$, and a connector-wire impedance $Z_3$ between said sensing impedance $Z_s$ and said current converging connector, wherein a portion $I_s$ of current signal $I_i$ flows through said sensing current path;
    said battery current path having a battery impedance $Z_b$ located along said battery current path, a connector-wire impedance $Z_2$ between said current dividing connector and said battery impedance $Z_b$, and a connector-wire impedance $Z_4$ between said battery impedance $Z_b$ and said current converging connector, wherein a portion $I_b$ of current signal $I_i$ flows through said battery path;
    a DC-blocking capacitor in series with said battery impedance $Z_b$ and located along said battery current path to prevent said battery from discharging current through said sensing impedance $Z_s$;
    said sensing current path also having a magnetic field sensor attached with a coupling thereto for measuring the magnitude and phase of $I_s$ and for determining the value of $Z_b$ using the equation $$Z_b = I'(Z_s + Z_1 + Z_3) + (Z_2 + Z_4)$$

where $$I' = \frac{I_s}{I_i - I_s},$$

so that:

$$Z_b = \frac{I_s}{I_i - I_s}(Z_s + Z_1 + Z_3) + (Z_2 + Z_4).$$

7. The apparatus for measuring impedance in an electrochemical cell of claim 6 further comprising an AC-choked load impedance $Z_L$ located along said battery current path in electrical parallel to said battery impedance $Z_b$, said load impedance $Z_L$ also being located between said connector-wire impedance $Z_2$ and said connector-wire impedance $Z_4$ for permitting online measurements of $Z_b$, $Z_L$ being much larger than $Z_s$ and $Z_b$.

8. The apparatus for measuring impedance in an electrochemical cell of claim 6 in which said measuring instrument for measuring the magnitude of $I_s$ includes a magnetic core having a magnetic core path and an air gap that dissects said core path, said sensing impedance $Z_s$ thereby representing a single turn winding on said magnetic core, and a magnetic field sensor being positioned in said air gap, the magnetic flux density to which said magnetic field sensor is exposed is given by the equation $$B_{gap} = \frac{\mu_0 \mu_{core}}{l_{core} + \mu_{core} l_{gap}} I_s$$

where $B_{gap}$ is the magnetic flux density of the air gap, $l_{gap}$ is the effective gap length, $l_{core}$ is the effective core flux path length, $\mu_{core}$ is the core permeability factor, and $\mu_o$ is the permeability of free space.

9. The apparatus for measuring impedance in an electrochemical cell of claim 6, said apparatus being configured to experimentally determine $Z_b$ by measuring the variable $I_s$ when at least two different calibrated impedances $Z_{cal1}$ and $Z_{cal2}$ are substituted for $Z_b$ using the equation $$Z_b = I'(Z_s + Z_1 + Z_3) + (Z_2 + Z_4)$$

wherein $$Z_x = I'Z_3 + Z_1 + Z_3$$

and $$Z_y = Z_2 + Z_4$$

so that $$Z_b = I'Z_x + Z_y$$

resulting in an $I_s$ value of $I_1$ when $Z_{cal1}$ is substituted for $Z_b$ and resulting in an $I_s$ value of $I_2$ when $Z_{cal2}$ is substituted for $Z_b$ so that $$Z_x = \frac{Z_{cal1} - Z_{cal2}}{I_1 - I_2},$$

and so that $$Z_y = \frac{I_2 Z_{cal1} - I_1 Z_{cal2}}{I_1 - I_2},$$

making the value of $Z_b$ solvable by substitution into the equation $$Z_b = I'Z_x + Z_y.$$

10. The apparatus for measuring impedance in an electrochemical cell of claim 6, said apparatus being configured to experimentally determine $Z_b$ by measuring the variable $I_s$ when multiple calibrated impedances $Z_{cal1}$ through $Z_{calN}$ are substituted for $Z_b$ using the equation $$Z_b = I'(Z_s + Z_1 + Z_3) + (Z_2 + Z_4)$$

wherein $$Z_x = Z_s + Z_1 + Z_3$$

and $$Z_y = Z_2 + Z_4$$

so that $$Z_b = I'Z_x + Z_y$$

resulting in an $I_s$ value of $I_1$ when $Z_{cal1}$ is substituted for $Z_b$ and resulting in an $I_s$ value of $I_N$ when $Z_{calN}$ is substituted for $Z_b$ so that $$Z_{cal1} = I_1 Z_x + Z_y,$$

and so that $$Z_{calN} = I_N Z_x + Z_y,$$

making the value of $Z_x$ through $Z_N$ solvable and thereby making the value of $Z_b$ solvable by substitution into the equation $$Z_b = I'Z_x + Z_y.$$

11. A method for measuring impedance in an electrochemical cell comprising:

producing an input current signal $I_i$ with a current generator along a current signal path in a current divider network;

establishing a sensing current path and a battery current path along said current divider network so that said sensing current and battery current paths are electrically parallel to each other and so that said parallel sensing current and battery current paths are in series with said current generator;

locating a measurable sensing impedance $Z_s$ along said sensing current path, locating a connector-wire impedance $Z_1$ between said current signal path and said sensing impedance $Z_s$ so that a portion of current signal $I_i$ flows from said current signal path through said connector-wire impedance $Z_1$ to said sensing impedance $Z_s$, and locating a connector-wire impedance $Z_3$ between said sensing impedance $Z_s$ and said current signal path so that current flows from said sensing impedance $Z_s$ through said connector-wire impedance $Z_3$ to said current signal path;

locating a battery impedance $Z_b$ along said battery current path, locating a connector-wire impedance $Z_2$ between said current signal path and said battery impedance $Z_b$ so that a portion of current signal $I_i$ flows from said current signal path through said connector-wire impedance $Z_2$ to said battery impedance $Z_b$, and locating a connector-wire impedance $Z_4$ between said battery impedance $Z_b$ and said current signal path so that current flows from said battery impedance $Z_b$ through said connector-wire impedance $Z_4$ to said current signal path; and locating a DC-blocking capacitor in series with said battery impedance $Z_b$ and located along said battery current path to prevent said battery from discharging current through said sensing impedance $Z_s$;

instrumentally measuring the magnitude and phase of $I_s$ with a magnetic field sensor and determining the value of $Z_b$ using the equation $$Z_b = I'(Z_s + Z_1 + Z_3) + (Z_2 + Z_4)$$

where $$I' = \frac{I_s}{I_i - I_s},$$

so that $$Z_b = \frac{I_s}{I_i - I_s}(Z_s + Z_1 + Z_3) + (Z_2 + Z_4).$$

12. The method for measuring impedance in an electrochemical cell of claim 11 in which the magnetic field sensor used for measuring the magnitude and phase of $I_s$ is a Hall effect sensor magnetically coupled to the sensing current path.

13. The apparatus for measuring impedance in an electrochemical cell of claim 11 in which the magnetic field sensor used for measuring the magnitude and phase of $I_s$ is a magnetoresistive sensor magnetically coupled to the sensing current path.

14. The method for measuring impedance in an electrochemical cell of claim 11 in which the value of battery impedance $Z_b$ is experimentally determined by measuring the variable $I_s$ when two different calibrated impedances $Z_{cal1}$ and $Z_{cal2}$ are substituted for $Z_b$ using the equation $$Z_b = I'(Z_s + Z_1 + Z_3) + (Z_2 + Z_4)$$

wherein $$Z_x = I'Z_3 + Z_1 + Z_3$$

and $$Z_y = Z_2 + Z_4$$

so that $$Z_b = I'Z_x + Z_y,$$

resulting in an $I_s$ value of $I_1$ when $Z_{cal1}$ is substituted for $Z_b$ and resulting in an $I_s$ value of $I_2$ when $Z_{cal2}$ is substituted for $Z_b$ so that $$Z_x = \frac{Z_{cal1} - Z_{cal2}}{I_1 - I_2},$$

and so that $$Z_y = \frac{I_2 Z_{cal1} - I_1 Z_{cal2}}{I_1 - I_2},$$

and then the value of $Z_b$ is solved for by substituting $Z_x$ and $Z_y$ into the equation $$Z_b = I'Z_x + Z_y.$$

15. The method of measuring impedance in an electrochemical cell of claim 11 in which the instrumental measurement of the magnitude of $I_s$ is accomplished using a magnetic field sensor having a magnetic core that has a magnetic core path and an air gap that dissects said core path, said sensing impedance $Z_s$ thereby representing a single turn winding on said magnetic core, a magnetic field sensor being positioned in said air gap, the magnetic flux density to which said magnetic field sensor is exposed is given by the equation $$B_{gap} = \frac{\mu_0 \mu_{core}}{l_{core} + \mu_{core} l_{gap}} I_s.$$

where $B_{gap}$ is the magnetic flux density of the air gap, $l_{gap}$ is the effective gap length, $l_{core}$ is the effective core flux path length, $\mu_{core}$ is the core permeability factor, and $\mu_o$ is the permeability of free space.

16. The method for measuring impedance in an electrochemical cell of claim 11 further comprising:

establishing a load impedance $Z_L$ located along said battery current path in electrical parallel to said battery impedance $Z_b$, said load impedance $Z_L$ also being located between said connector-wire impedance $Z_2$ and said connector-wire impedance $Z_4$; and AC-choking said load impedance $Z_L$ for permitting online measurements of $Z_b$, $Z_L$ being much larger than $Z_s$ and $Z_b$.

17. An apparatus for measuring impedance in an electrochemical cell comprising:

a voltage generator for producing an input current signal $I_b$ that flows along a current signal path through a battery having a battery impedance $Z_b$, said battery being located along said current signal path;

said current signal path having a measurable sensing impedance $Z_s$ located along said current signal path in series with said battery impedance $Z_b$;

a DC-blocking capacitor in series with said battery impedance $Z_b$ located along said current signal path in series with said battery impedance $Z_b$ and interpositioned along said path between said battery impedance $Z_b$ and said sensing impedance $Z_s$ to prevent said battery from discharging through said sensing impedance $Z_s$;

said sensing impedance $Z_s$ having a sensing current $I_s$, a known source voltage $V_i$, and a magnetic field sensor with a coupling attached thereto for measuring the magnitude and phase of the sensing current $I_s$ using the relation $$I_s = \frac{V_i}{Z_b + Z_s}$$

making said battery impedance $Z_b$ determinable by the relation $$Z_b = \frac{V_i - I_s Z_s}{I_s}.$$

* * * * *

UNITED STATES PATENT AND TRADEMARK OFFICE
CERTIFICATE OF CORRECTION

PATENT NO. : 6,307,378 B1
DATED : October 23, 2001
INVENTOR(S) : James D. Kozlowski It is certified that error appears in the above-identified patent and that said Letters Patent is hereby corrected as shown below:

Column 1,
Line 11, add -- This invention was made with support from the Government under Contract No. N00014-98-1-0795. The Government has certain rights in this invention. --.

Signed and Sealed this

Thirty-first Day of January, 2006

JON W. DUDAS
*Director of the United States Patent and Trademark Office*